US007171005B2

(12) United States Patent
Lewiner et al.

(10) Patent No.: US 7,171,005 B2
(45) Date of Patent: Jan. 30, 2007

(54) P.A. SYSTEM INSTALLATION METHOD

(75) Inventors: Jacques Lewiner, Saint-Cloud (FR); Sylvain Charles Javelot, Paris (FR); Damien Georges Pierre Lebrun, Houilles (FR); Stephane Andre Roger Debusne, Montrouge (FR)

(73) Assignee: Cynove Sarl, Paris (FR)

( * ) Notice: Subject to any disclaimer, the term of this patent is extended or adjusted under 35 U.S.C. 154(b) by 217 days.

(21) Appl. No.: 10/517,431

(22) PCT Filed: Jun. 6, 2003

(86) PCT No.: PCT/FR03/01694

§ 371 (c)(1),
(2), (4) Date: Dec. 10, 2004

(87) PCT Pub. No.: WO03/105525

PCT Pub. Date: Dec. 18, 2003

(65) Prior Publication Data

US 2005/0226440 A1 Oct. 13, 2005

(30) Foreign Application Priority Data

Jun. 10, 2002 (FR) .................................. 02 07110

(51) Int. Cl.
*H04B 3/00* (2006.01)
*H03G 1/40* (2006.01)
*H03G 5/00* (2006.01)
*H03G 3/00* (2006.01)

(52) U.S. Cl. ........................... 381/77; 381/80; 381/97; 381/98; 381/61; 381/103

(58) Field of Classification Search .................... None
See application file for complete search history.

(56) References Cited

U.S. PATENT DOCUMENTS 4,458,362 A 7/1984 Berkovitz et al.

(Continued)

FOREIGN PATENT DOCUMENTS

EP 1 017 166 7/2000

*Primary Examiner*—Laura A. Grier
(74) *Attorney, Agent, or Firm*—Young & Thompson

(57) ABSTRACT

The invention concerns a method for transmitting in an area (100) information items in the form of sound waves representing a signal X(t), through a loudspeaker enclosure (2), said method comprising a step of setting up a public address system which consists in applying to the input of the loudspeaker enclosure (2) an electric signal P(t)=W(t) ?X(t) wherein is the convolution product and W(t)=S(−t)? I(t), wherein S(−t) is the temporal return of the pulse response S(t) between the enclosure and the target zone (101) belonging to the area to be fitted with a P.A. system (100) t representing time, and I(t) is the temporal response of the product $e^{-2i\pi f t0}$.Sc (f), wherein f represents the frequency, t0 is a constant Sc(f)=1/(S1(f))$^{\alpha}$, α being a non-null positive number and S1(f) being a real function obtained by peak clipping of the modulo I S(f) I of the frequency response S(f) of S(t).

20 Claims, 2 Drawing Sheets

U.S. PATENT DOCUMENTS

Figure 1:
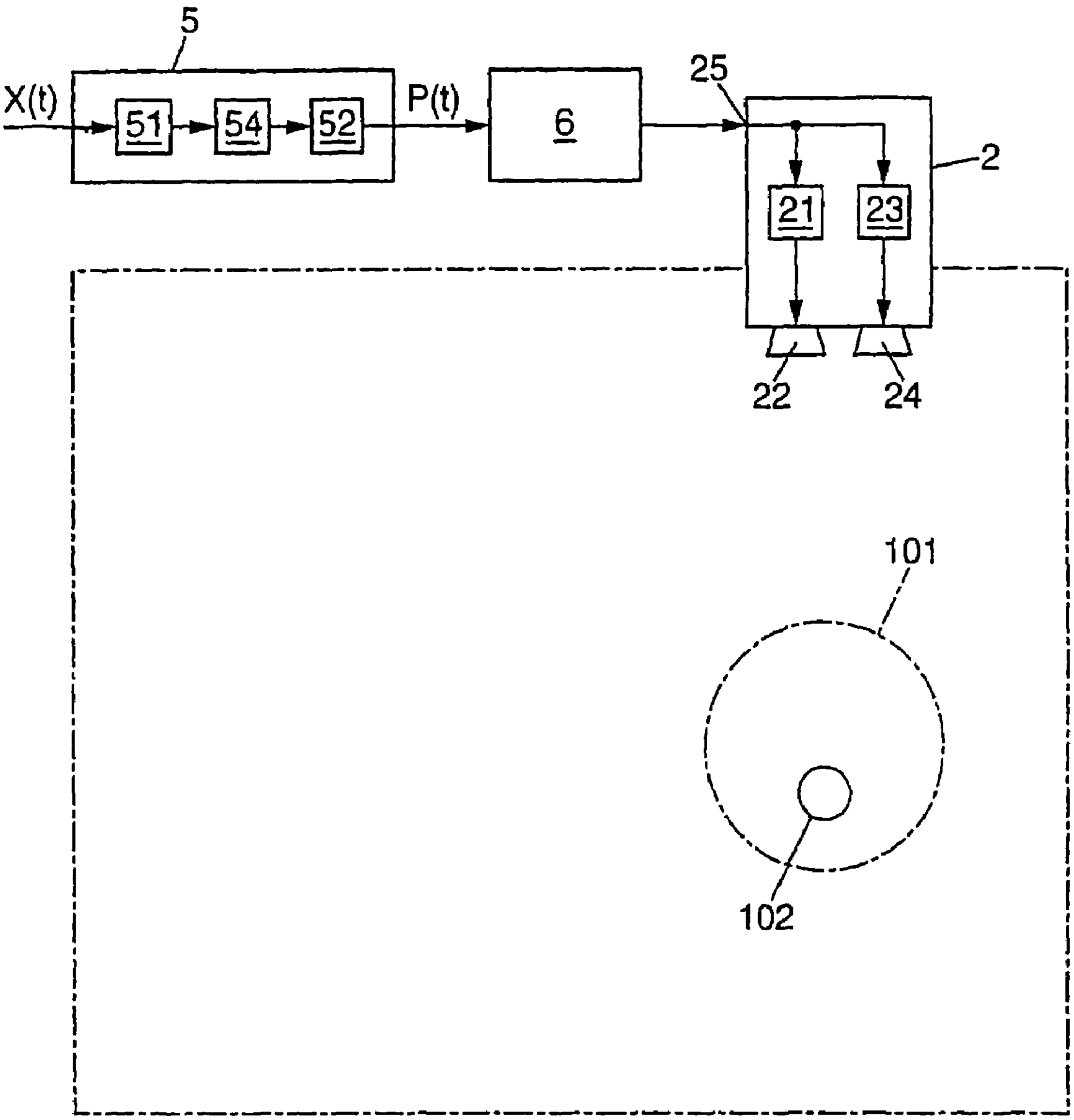

| | | | | | |
|---|---|---|---|---|---|
| 4,683,590 | A | | 7/1987 | Miyoshi et al. | |
| 4,888,808 | A | | 12/1989 | Ishikawa et al. | |
| 5,025,472 | A | * | 6/1991 | Shimizu et al. | 381/63 |
| 5,233,661 | A | * | 8/1993 | Kawamura et al. | 381/61 |
| 5,384,856 | A | * | 1/1995 | Kyouno et al. | 381/103 |
| 5,452,360 | A | * | 9/1995 | Yamashita et al. | 381/63 |
| 5,572,443 | A | * | 11/1996 | Emoto et al. | 702/103 |
| 5,694,476 | A | | 12/1997 | Klippel | |
| 5,815,580 | A | | 9/1998 | Craven et al. | |
| 6,519,344 | B1 | * | 2/2003 | Yajima et al. | 381/103 |
| 2002/0051548 | A1 | * | 5/2002 | Terai et al. | 381/310 |

* cited by examiner

P.A. SYSTEM INSTALLATION METHOD

The present invention relates to methods for sound systems, including correcting the response of acoustical enclosures.

There is a need for tools for correcting the response of acoustical enclosures because if analogue or digital acoustic data representation mediums allow quantities to be stored and reproduced with a large dynamic range (for example 96 dB or more) and a good adherence to the phase, on the whole of the audible acoustic band, the loudspeakers constitute the weakest element in a chain of sound reproduction.

In the past numerous techniques have been proposed in an attempt to resolve this problem.

For example, the amplitude at the amplifier feeding one or more loudspeakers may be corrected, by using a template of the amplifier gain as a function of the frequency. In this way, for a loudspeaker having a response in amplitude lower than the average in a given spectral band, the amplification in the said band is accentuated so that the sound emitted is appreciably constant in the whole of the audible band. U.S. Pat. No. 4,458,362 proposes developing the gain template in question starting from test signals emitted by the loudspeaker. The technique used in this document raises numerous problems of implementation in a real situation and in particular in a resonating environment. Above all, this technique does not conserve the phase of the electric signals to be transformed into audio signals.

A second much used approach for correcting the response of an enclosure, consists of regrouping in one enclosure several loudspeakers, each having good characteristics in a given spectral band and placing between the input of the enclosure and the loudspeakers, filters which will selectively send to each loudspeaker, the spectral components of the electric signal best adapted to that loudspeaker. This method, which allows the response in global amplitude of the enclosure to be improved, suffers from the severe disadvantage of introducing phase shifting at several points in the system and thereby not allowing a true reproduction as regards the phase of the signals being reproduced. Furthermore, in a lot of cases, to ensure a good quality of listening, it is more important to respect the phase than the amplitude.

It has also been proposed, in U.S. Pat. No. 5,815,580, to only take account of the phase shifts introduced by the passive filters present in the acoustical enclosure. Such a solution suffers severe disadvantages, in particular, it does not compensate for the phase shifts introduced by the loudspeakers themselves and it does not take account of the environment of the enclosure whereby the phase correction performed by the filter proposed in this document is inefficient. Furthermore it requires:

either access by the user to the passive filters which requires taking apart, the enclosure and which is obviously not desirable or the putting in place in the enclosure, during its manufacture, of means for disconnecting the loudspeakers from the filters and of electrical access to the output of the said filters, which introduces high costs and leads to risks of electrical parasites.

Another known technique disclosed namely in document U.S. Pat. No. 4,888,808 uses, starting from the initial impulse response of the acoustical enclosure, a series of operations based on the Fourier transformation to obtain firstly the response of the enclosure in the frequency domain in amplitude and in phase, and secondly, the filter template which applied to the acoustical enclosure is supposed to correct the phase defects while respecting in theory the amplitude of the signals. The practical implementation of such a solution from signal processors presents severe disadvantages. In fact, the impulse response of the acoustical enclosures in the frequency domain, particularly in a resonating environment, presents considerable shifts in the amplitude of the signals as a function of the frequency: often the response in amplitude of an enclosure presents peaks towards the top or towards the bottom which can reach 50 dB and of which the width in frequency is often small. Consequently, with the technique proposed in the document U.S. Pat. No. 4,888,808, the construction of the template of an efficient corrector filter for obtaining a satisfactory correction implies considerable calculating power, which leads to the use of expensive processors. In addition, even these expensive processors do not evidently have an infinite range thus leading to insufficient improvements.

The present invention aims namely to provide a method of correction of the response of an acoustic enclosure which allows the phase of the signals being reproduced to be conserved in a wide band of frequencies, while requiring a calculating power compatible with the size and the cost of reproduction apparatus destined for the general public.

To this effect, the present invention proposes a method of sound diffusion of a space in order to transmit in this space information in the form of acoustic waves representative of a signal X(t), by means of at least one acoustic enclosure having at least one input controlling a number n of loudspeakers, n being a natural integer greater than or equal to 1, this method comprising at least one step of sound diffusion during which an electrical signal $P(t)=W(t)\otimes X(t)$ is applied to the input of the acoustic enclosure where:

$\otimes$ is the mathematical convolution product operator and

W(t) represents a filter template previously determined and memorised, the said method comprising a training step during which the filter template is determined as follows:

$$W(t)=S(-t)\otimes I(t),\ \text{where}$$

S(−t) is the temporal return of the impulse response S(t) between the enclosure and a target zone of the space where sound is diffused, t representing the time, and I(t) is the temporal response of the product $e^{-2i\pi f t0}$.Sc(f), where f represents the frequency, t0 is a time shift coefficient and $Sc(f)=1/(S1(f))^{\alpha}$, $\alpha$ being a non zero positive number and S1(f) being a real function obtained by clipping the module |S(f)| of the response in frequency S(f) of the impulse response S(t).

Owing to these arrangements which allow the phase shifts introduced by the enclosure to be compensated, the information transmitted in the form of acoustic waves is received perfectly in phase in the target zone.

Furthermore, owing to the clipping of the signal S(f), the method according to the invention only requires a relatively small calculating capacity, compatible with moderate costs needed for applications destined for the general public.

Finally, the inventors were able to note that the clipping of the signal S(f) does not destroy the quality of listening, owing to an effect called 'masking effect', which makes the human ear discern, with a lowered sensitivity, the sounds of neighbouring frequency to a given frequency where a signal is audible.

The quality of listening obtained with the present invention is therefore excellent at a moderate cost. In preferred embodiments of the invention, one may further use one and/or the other of the following dispositions:

during the training step the Sc(f) function is determined as follows:

.for $Sfmoy.R2<|S(f)|<Sfmoy.R1$, $Sc(f)=1/|S(f)|^{\alpha}$,

R1 and R2 being two positive numbers, R1 being greater than R2 and Sfmoy being the mean value of |S(f)|, .for $|S(f)|\leqq Sfmoy.R2$, $Sc(f)=1/(Sfmoy.R2).^{\alpha}$, .for $|S(f)|\geqq Sfmoy.R1$, $Sc(f)=1/(Sfmoy.R1).^{\alpha}$;

the coefficient of the temporal shift t0 is comprised between 0 and Tmax, Tmax being the recording duration of the response S(t);

I(t) is obtained using the real part of the inverse Fourier transform of the product $e^{-2i\pi ft0}$.Sc(f);

the impulse response S(t) is memorised on a number $2^k$ of samples, K being a natural integer greater than or equal to 1;

the impulse response S(t) is memorised on a number $2^k$ of samples and S(f) is calculated from S(t), using a technique of fast Fourier transform of S(t);

the impulse response S(t) is memorised on a number $2^k$ of samples and I(t) is calculated from the product $e^{-2i\pi ft0}$.Sc(f) using a fast inverse Fourier transform technique;

α equals 1;

the coefficients R1 and R2 are chosen so as to obtain an amplitude excursion of around 24 dB (namely when the method is implemented by processors processing data on 16 bits)

the coefficients R1 and R2 are chosen so as to obtain an amplitude excursion of around 12 dB (namely when the method is implemented by processors processing data on 16 bits)

the coefficients R1 and R2 are chosen so as to obtain an amplitude excursion of around 36 dB (namely when the method is implemented by processors processing data on 16 bits)

the coefficients R1 and R2 are chosen so as to obtain an amplitude excursion of around 48 dB (namely when the method is implemented by processors processing data on 16 bits)

the quantity Sfmoy is calculated for a band of frequencies fb representing only a portion of the audible frequencies.

Other features and advantages of the invention will appear from the following detailed description of one of its embodiments, given by way of a non-limiting example, with regard to the appended drawings.

In the drawings

FIG. 1 is schematic functional diagram showing an example of a device for implementing the method according to the invention, in normal operation, i.e. during the phase of sound transmission mentioned above, FIG. 2 is a schematic diagram similar to FIG. 1 showing the device during the initial phase of training.

As shown in FIG. 1, the method according to the invention allows sound to be diffused in a space 100 ensuring optimal listening for a listener 102 in a target zone 101 of space 100.

The space 100 where sound is to be diffused may for example be a sound room equipped with at least one acoustical enclosure 2, containing a number n of loudspeakers 22, 24, n being a natural integer at least equal to 1, for example, greater or equal to 2.

Loudspeakers 22, 24 of the enclosure 2 can for example be fed each by a common input 25 through passive filters, 21,23 respectively. This input 25 receives an electrical signal generated by an amplifier 6, from an electrical signal P(t) output from a calculator 5 (amplifier 5 and calculator 5 may of course be contained in the same box). The calculator 5 may contain for example a calculating unit 51 which receives an electrical signal x(t), to be reproduced in the form of sound in the space 100 (t representing time), a corrector filter 54 of model W(t) receiving the signals output from the calculating unit 51, and a digital-analogue converter 52 which receives the digital signals output from filter 52 and sends corresponding analogue signals to the amplifier 6.

One will note that this filter 54 may simply consist of a software module, downloaded into calculator 5 and digital-analogue converter 52 can be removed when using digital loudspeakers.

The method according to the invention namely allows phase shifts habitually experienced by sound waves on arriving at the listener 102, in systems of the prior art, to be avoided. These phase shifts have several origins, in particular:

the passive filters 21 and 23 present in the enclosure 2 are different and as a consequence they introduce different phase shifts similarly, loudspeakers 22, 24 are different and introduce different phase-shifts, etc.

To this effect, according to the invention the electrical signal X(t) is processed by the corrector filter 54 of the calculator 5 during sound diffusion phases, i.e. during normal operation of the sound diffusion device. During the processing, the filter 54 calculates P(t) in performing the following convolution product: $P(t)=W(t)\otimes X(t)$.

Figure 2:
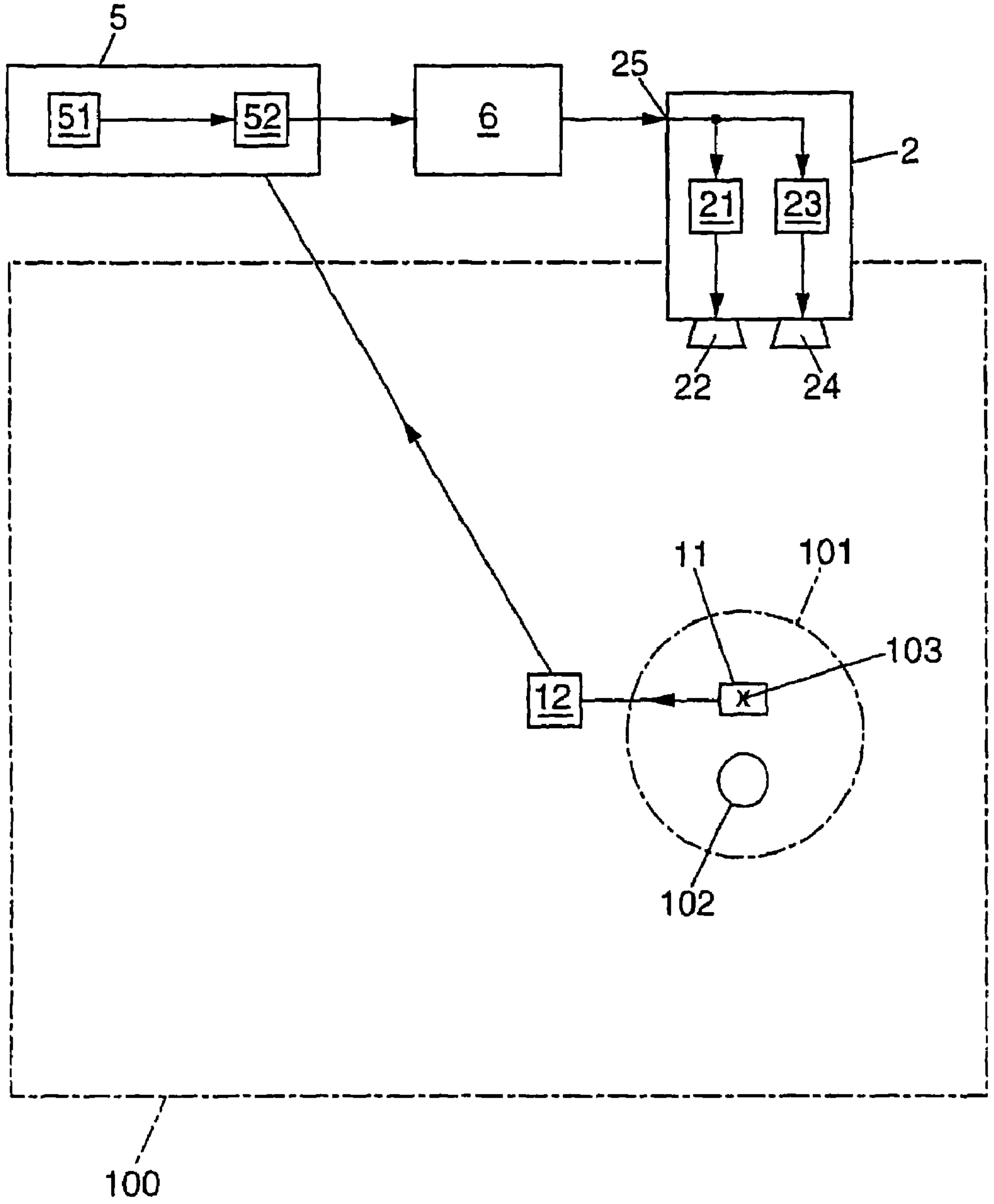

In order to determine the model W(t), as represented on FIG. 2, one firstly proceeds to an operation of acoustic calibration of the space 100 in determining the impulse response S(t) between the acoustical enclosure 2 and a point of calibration 103 of the target zone 101.

The point of calibration 103 can for example be situated between 50 cm and 1 m 50 above the ground.

The impulse response S(t) corresponds to the acoustic signal received at the point 103 when the acoustic enclosure emits an acoustic impulse of short duration.

This impulse response can be measured preferably at a moment where the space 100 is not polluted by acoustic signals other than those emitted by the enclosure 2, for example by making the enclosure 2 emit a short acoustic impulse and by measuring the acoustic signals received following this impulse at the calibration point 103, by means of a microphone 11 previously disposed at the point 103.

In the particular example represented on FIG. 2, the acoustic enclosure 2 receives from the calculator 5 the impulse signal to be emitted.

Furthermore, the microphone 11 situated at the point of calibration 103 is connected to an amplifier 12, itself connected to an analogue-digital converter 3, this converter may, for example, be connected to the calculator 5 in such a way that the signals picked up by the microphone 11 can be memorised by the calculator 5 for the point of calibration 103.

The impulse response S(t) thus memorised by the calculator 5 is then temporally inversed by the calculator 5, which finally memorises the temporal inverse of the impulse response S(−t). Once the calibration operation is finished, the microphone 11 with its amplifier 12 and its converter 3 is disassembled. Afterwards, if S(t) has been recorded on a number $2^k$ of samples, the calculator 5 determines the response S(f), by a fast Fourier transform technique of the impulse response S(t). It is recalled that for an input vector S(t) containing $2^k$ samples, S(f) is a vector of $2^k$ samples with:

$$S(f)=\sum_{m=1}^{2^K} S(m)\cdot e^{-2i\pi(f-1)\cdot(m-1)/2^K},$$

for $1\leqq f\leqq 2^k$.

Then the calculator 5 carries out the following sequence of operations:

it determines and memorises the module of S(f), namely |S(f)|, it determines and memories the average value attained by |S(f)| noted Sfmoy (arithmetical average, logarithmic average or other)

for all frequencies f, such that Sfmoy.R2<|S(f)|≦<Sfmoy.R1, it constructs and memorises Sc(f) as $1/|S(f)|^{\alpha}$, for all frequencies f, such that |S(f)|≦Sfmoy.R2, it constructs and memorises Sc(f) as 1/(Sfmoy.R2), for all frequencies f, such that |S(f)|≧Sfmoy.R1, it constructs and memorises Sc(f) as $1/(\text{Sfmoy.R1})^{\alpha}$, α being a non zero positive number, advantageously equal to 1, it carries out the multiplication of Sc(f), by a function $y(f)=e^{-2i\pi ft0}$, where t0 is a temporal shift comprised between 0 and Tmax [Tmax being the recording duration of the response S(t)] chosen to adhere to the chronology of the events (principle of causation): t0 can advantageously be chosen equal to Tmax/2, or equals a lower value, and finally it determines and memorises the result I(f):

$$I(f)=y(f).Sc(f)$$

On will note that the Sc(f) function could more generally be calculated in a $Sc(f)=1/[S1(f)]^{\alpha}$ form where S1(f) is a function obtained by clipping of the S(f) module.

The calculator (5) then calculates the inverse Fourier transform of I(f), namely I(t).

It is recalled that the fast inverse Fourier transform of I(f), I(t) is a vector of $2^k$ samples with:

$$I(t)=(1/2^K)\cdot\sum_{m=1}^{2^K} I(m)\cdot e^{2i\pi(m-1)\cdot(t-1)/2^K},\ 1\leq t\leq 2^k.$$

The filter model W(t) is then obtained by the calculator 5 by performing the convolution product of S(−t) with I(t), this allowing the software filter module 54 to be downloaded into calculator 5 and ends the training step.

It is recalled that the convolution product of a function f(t) by a function g(t) equals:

$$f(t)\otimes g(t)=\int_{-\infty}^{+\infty} f(\tau)\cdot g(t-\tau)\cdot d\tau$$

Naturally and as will be apparent from the foregoing, the invention is not limited in any way to the particular example of the particular embodiment which has just been described, on the contrary it extends to any variant in particular those in which:

the impulse response S(t) is determined in ways other than by emitting acoustic impulse signals, for example by emitting white noise or series of predetermined signals from which one can extract the response S(t) by well known calculating methods, explained for example in document FR-A-2 747 863 for calculating impulse response in the domain of radio-electric waves the space to be diffused with sound can be anything other than a sound room, for example an anechoide room, the objective being in this case for example to make a processing unit and acoustical enclosure assembly such that the phase of the acoustic waves emitted by the acoustical enclosure respects the phase of the electrical signals sent to the input of the said assembly.

The invention claimed is:

1. A method of diffusing sound in a space in order to transmit in this space information in the form of acoustic waves representative of a signal X(t), by means of at least one acoustic enclosure having at least one input controlling a number n of loudspeakers, n being a natural integer greater than or equal to 1, this method comprising at least one step of sound diffusion during which an electrical signal P(t)=W(t)⊗X(t) is applied to the input of the acoustic enclosure where:

⊗ is the mathematical convolution product operator and

W(t) represents a filter template previously determined and memorised, the said method comprising a training step during which the filter template is determined as follows:

$W(t)=S(-t)\otimes I(t)$, where

S(−t) is the temporal return of the impulse response S(t) between the enclosure and a target zone of the space where sound is diffused, t representing the time, and I(t) is the temporal response of the product $e^{-2i\pi ft0}$.Sc(f), where f represents the frequency, t0 is a time shift coefficient and $Sc(f)=1/(S1(f))^{\alpha}$, α being a non zero positive number and S1(f) being a real function obtained by clipping the module |S(f)| of the response in frequency S(f) of the impulse response S(t).

2. A method according to claim 1, wherein during the training step the function Sc(f) is determined as follows:

.for $Sfmoy.R2<|S(f)|<Sfmoy.R1,\ Sc(f)=1/|S(f)|^{\alpha}$,

R1 and R2 being two positive numbers, R1 being greater than R2 and Sfmoy being the mean value of |S(f)|, .for $|S(f)|\leqq Sfmoy.R2,\ Sc(f)=1/(Sfmoy.R2).^{\alpha}$, .for $|S(f)|\geqq Sfmoy.R1,\ Sc(f)=1/(Sfmoy.R1).^{\alpha}$.

3. A method according to claim 2, wherein the coefficients R1 and R2 are chosen so as to obtain an amplitude excursion chosen from among an excursion of around 12 dB, an excursion of around 24 dB, an excursion of around 36 dB and an excursion of around 48 dB.

4. A method according to claim 3, in which the quantity Sfmoy is calculated for a band of frequencies fb representing only a portion of the audible frequencies.

5. A method according to claim 2, wherein the coefficient of the temporal shift t0 is comprised between 0 and Tmax, Tmax being the recording duration of the response S(t).

6. A method according to claim 2, wherein I(t) is obtained using the real part of the inverse Fourier transform of the product $e^{-2i\pi ft0}$.Sc(f).

7. A method according to claim 2, wherein the impulse response S(t) is memorised on a number $2^k$ of samples, and S(f) is calculated from S(t), using a technique of fast Fourier transform of S(t).

8. A method according to claim 2, wherein the impulse response S(t) is memorised on a number $2^k$ of samples and I(t) is calculated from the product $e^{-2i\pi ft0}$.Sc(f) using a fast inverse Fourier transform technique.

9. A method according to claim 3, wherein the coefficient of the temporal shift t0 is comprised between 0 and Tmax, Tmax being the recording duration of the response S(t).

10. A method according to claim 3, wherein I(t) is obtained using the real part of the inverse Fourier transform of the product $e^{-2i\pi ft0}$.Sc(f).

11. A method according to claim 3, wherein the impulse response S(t) is memorised on a number $2^k$ of samples, and S(f) is calculated from S(t), using a technique of fast Fourier transform of S(t).

12. A method according to claim 3, wherein the impulse response S(t) is memorised on a number $2^k$ of samples and I(t) is calculated from the product $e^{-2i\pi ft0}$.Sc(f) using a fast inverse Fourier transform technique.

13. A method according to claim 4, wherein I(t) is obtained using the real part of the inverse Fourier transform of the product $e^{-2i\pi ft0}$.Sc(f).

14. A method according to claim 4, wherein the impulse response S(t) is memorised on a number $2^k$ of samples, and S(f) is calculated from S(t), using a technique of fast Fourier transform of S(t).

15. A method according to claim 4, wherein the impulse response S(t) is memorised on a number $2^k$ of samples and I(t) is calculated from the product $e^{-2i\pi ft0}$.Sc(f) using a fast inverse Fourier transform technique.

16. A method according to claim 1, wherein the coefficient of the temporal shift t0 is comprised between 0 and Tmax, Tmax being the recording duration of the response S(t).

17. A method according to claim 1, wherein I(t) is obtained using the real part of the inverse Fourier transform of the product $e^{-2i\pi ft0}$.Sc(f).

18. A method according to claim 1, wherein the impulse response S(t) is memorised on a number $2^k$ of samples, and S(f) is calculated from S(t), using a technique of fast Fourier transform of S(t).

19. A method according to claim 1, wherein the impulse response S(t) is memorised on a number $2^k$ of samples and I(t) is calculated from the product $e^{-2i\pi ft0}$.Sc(f) using a fast inverse Fourier transform technique.

20. A method according to claim 1, wherein $\alpha$ equals 1.

* * * * *